United States Patent [19]

Malhi

[11] Patent Number: 5,286,995
[45] Date of Patent: Feb. 15, 1994

[54] ISOLATED RESURF LDMOS DEVICES FOR MULTIPLE OUTPUTS ON ONE DIE

[75] Inventor: Satwinder Malhi, Garland, Tex.

[73] Assignee: Texas Instruments Incorporated, Dallas, Tex.

[21] Appl. No.: 913,570

[22] Filed: Jul. 14, 1992

[51] Int. Cl.$^5$ .................. H01L 29/00; H01L 29/76; H01L 29/94; H01L 23/58

[52] U.S. Cl. .................. 257/549; 257/343; 257/409; 257/492; 257/547

[58] Field of Search .............. 257/339, 343, 409, 492, 257/500, 547, 544, 337, 549, 408

[56] References Cited

U.S. PATENT DOCUMENTS

| | | | |
|---|---|---|---|
| 4,593,458 | 6/1986 | Adler | 257/492 |
| 4,890,146 | 12/1989 | Williams et al. | 257/339 |
| 4,969,030 | 11/1990 | Musumeci et al. | 257/549 |
| 4,994,904 | 2/1991 | Nakagawa et al. | 257/339 |
| 5,072,267 | 12/1991 | Hattori | 257/409 |
| 5,087,954 | 2/1992 | Shirai | 257/409 |
| 5,156,989 | 10/1992 | Williams et al. | 437/41 |

OTHER PUBLICATIONS

IEDM Technical Digest, Dec. 3–5, 1979, "High voltage thin layer devices (RESURE DEVICES)", by Appels et al., pp. 238–241.

Primary Examiner—William Mintel
Assistant Examiner—Steven Loke
Attorney, Agent, or Firm—Thomas G. Eschweiler; Rene E. Grossman; Richard Donaldson

[57] ABSTRACT

A power transistor having an epitaxial layer within an isolation region is formed in a semiconductor substrate. A buried diffusion within the substrate with vertical diffusions contacting it form the isolation region. A drain, source, gate, and drift region are formed within the epitaxial layer such that a RESURF LDMOS transistor is formed having its source isolated from the substrate. Multiple power transistors may share the buried isolation region. A P type semiconductor substrate allows the power transistor and high performance CMOS circuitry to be formed on the same semiconductor die.

4 Claims, 3 Drawing Sheets

ISOLATED RESURF LDMOS DEVICES FOR MULTIPLE OUTPUTS ON ONE DIE

FIELD OF THE INVENTION

This invention is in the field of semiconductor integrated circuits and relates primarily to high power devices.

BACKGROUND OF THE INVENTION

In the field of power integrated circuits much work has been done in the development of power transistors. Advancements were made enabling LDMOS power transistors (Lateral Double-diffused MOS transistor) to exhibit low "on-resistance" (RDSon) and high breakdown capability concurrently through a reduced surface field (RESURF) technique (J. A. Appels and H. M. J. Vaes, "High Voltage Thin Layer Devices (RESURF Devices)", IEDM Tech. Dioest, pp. 238-241, 1979).

In the past, RESURF LDMOS transistors commonly were used in low side driver applications because the transistor structure couples the source to the substrate which in turn is coupled to ground. (A low side driver configuration consists of a transistor with its source coupled to ground and its drain coupled to an output load.) Therefore, RESURF LDMOS transistors were not utilized in high side driver applications and other applications that mandated electrical isolation between the source and substrate. (A high side driver configuration consists of the drain of a transistor coupled to circuitry or a power supply and the source coupled to an output load.)

It is an object of this invention to provide a high power integrated circuit device with electrical isolation between source and substrate. It is another object of this invention to provide a RESURF LDMOS transistor structure that enables multiple RESURF LDMOS transistors to be formed on a single semiconductor die and remain electrically isolated form one another. It is another object of this invention to provide a RESURF LDMOS transistor structure that is compatible with high performance CMOS circuitry.

Other objects and advantages of the invention will become apparent to those of ordinary skill in the art having reference to the following specification together with the drawings herein.

SUMMARY OF THE INVENTION

An integrated circuit RESURF (REduced SURface Field) LDMOS (Lateral Double-diffused MOS) transistor provides ease of fabrication and allows multiple LDMOS transistors to be fabricated on a single semiconductor die while remaining electrically isolated from one another as well as electrically isolated from the substrate. This allows the RESURF LDMOS transistor to be advantageously used in applications requiring electrical isolation between the source and substrate. The RESURF LDMOS transistor is also fabricated on a p type semiconductor substrate thus allowing fabrication compatibility between the RESURF LDMOS transistor and high performance CMOS circuitry thus increasing the scope of the device's applicability.

A power transistor having an epitaxial layer within an isolation region is formed in a semiconductor substrate. A buried diffusion within the substrate with vertical diffusions contacting it form the isolation region. A drain, source, gate, and drift region are formed within the epitaxial layer such that a RESURF LDMOS transistor is formed having its source isolated from the substrate. Multiple power transistors may share the buried isolation region.

DETAILED DESCRIPTION OF THE PREFERRED EMBODIMENT

Figure 1:
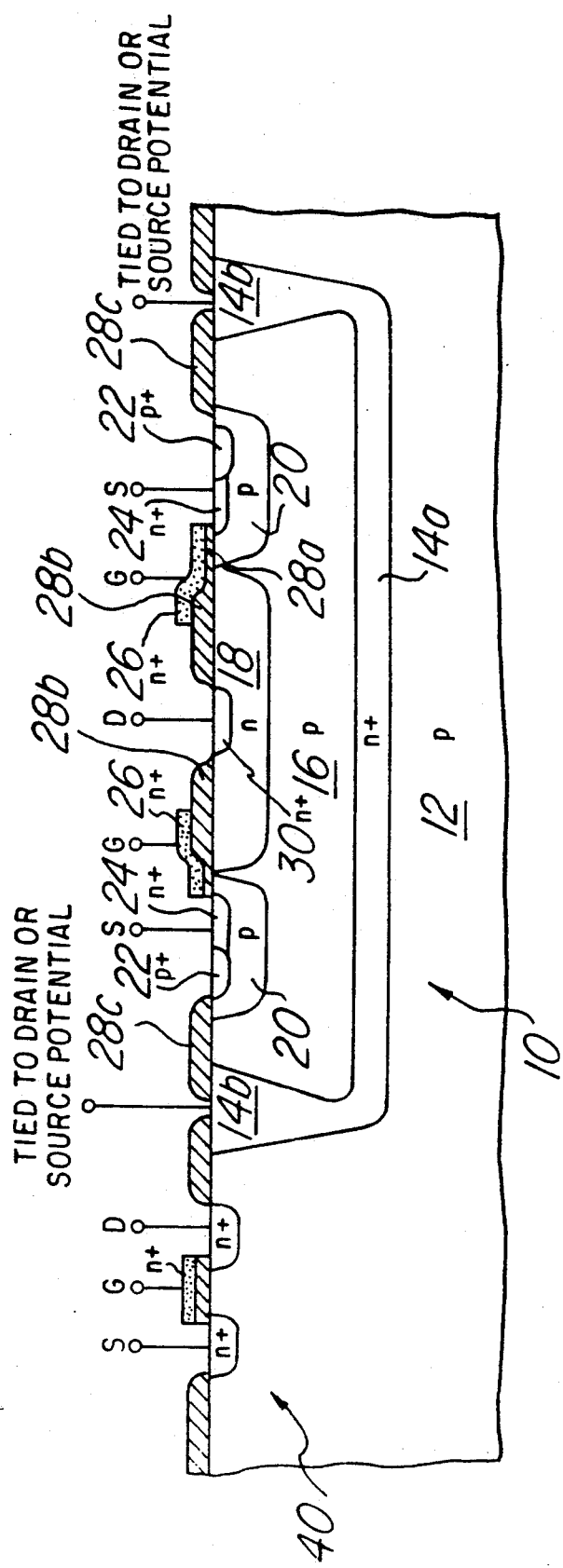
FIG. 1 is a cross section drawing illustrating the preferred embodiment of the invention.

FIG. 1 is a cross section drawing illustrating the preferred embodiment of the invention. RESURF LDMOS transistor 10 has a source 24 and a backgate 22 formed in a body region 20. A drain 30 is formed in a drift region 18. Drift region 18 and body region 20 are formed in an epitaxial region 16 (hereafter referred to as epi region 16) which is isolated from a semiconductor substrate 12 due to an isolation region 14a. Isolation region 14a may be connected to the source or drain potential of transistor 10 or the highest potential of the circuit containing transistor 10. These connections prevent transistor 10 leakage by preventing forward biasing of isolation region 14a/epi region 16 and isolation region 14a/substrate 12 junctions. Isolation region 14a has a minimum thickness and doping concentration which is a function of transistor 10 requirements. Primarily, the doping concentration is high and the thickness is substantial in order to minimize the effects of a parasitic PNP transistor composed of epi region 16 (P type), isolation region 14a (N type), and substrate 12 (P type). High doping concentration and substantial thickness of isolation region 14a cause the parasitic PNP transistor to have a very poor gain; therefore, the effects of the parasitic PNP transistor are minimized. A polysilicon layer 26 is formed over a gate oxide 28a and a thick oxide 28b to form a gate 26. A thick oxide 28c has openings in it for contact down to a plurality of sinker regions 14b for contact down to isolation region 14a. Sinker regions 14b are electrically connected to drain 30 or source 24 through metal interconnects (not shown in FIG. 1) to maintain a potential on isolation region 14a greater than the potential at substrate 12 and epi region 16 for the reason stated above.

RESURF LDMOS transistor 10 is fabricated in the following manner. An N+ type isolation region 14a is implanted in substrate 12. An epi region 16 is deposited over isolation region 14a; the thickness of epi region 16 is a function of the breakdown voltage rating required. Epi region 16 thickness is directly proportional to the breakdown voltage rating; therefore, a thicker epi region 16 will provide higher transistor breakdown performance. A thick, patterned $SiO_2$ layer (approximately 2500 Å) is formed over the wafer and N+ type sinker regions 14b are implanted into epi region 16. A thermal process then drives sinker regions 14b down into epi region 16 so that sinker regions 14b make contact with isolation region 14a. The $SiO_2$ layer is removed and a thin $SiO_2$ layer (approximately 500 Å) is formed over the wafer. A masked implant is performed to form drift region 18. Using a standard LOCOS field oxidation process a masked $Si_3N_4$ layer is formed (approximately 2000 Å) on the wafer. A thick $SiO_2$ layer (approximately 6000 Å) is formed over the areas unmasked by Si₃N₄. The Si₃N₄ layer (and the thin SiO₂ layer that existed underneath it) is removed with a wet etch and a thin gate oxide (SiO₂, approximately 500 Å) is grown over the wafer surface. A polysilicon layer is formed over the wafer surface; the polysilicon layer is heavily doped with either phosphorous or arsenic so that the polysilicon becomes N+ type polysilicon. The polysilicon layer is etched leaving a portion that forms a gate 26. A masked P type implant is performed with boron and forms body region 20. A thermal process causes body region 20 to outdiffuse such that body region 20 abuts drift region 18. A masked N+ type implant forms source 24 in body region 20 and drain 30 in drift region 18. A masked P+ implant forms backgate 22, abutting source 24, in body region 20. A thick SiO₂ layer (approximately 10,000 Å) is formed over the wafer surface and contacts are etched into the layer for contact down to source region 24, drain region 30, gate 26, and sinker regions 14b. A metal is deposited and etched for interconnects between transistor 10 and other semiconductor components on the die. A passivation layer is formed over the metal to protect the transistor.

Transistor 10 provides low transistor "on-resistance" (RDSon) and improved breakdown voltage performance of prior art LDMOS RESURF transistors. An additional advantage of transistor 10 is the isolation of source 24 from substrate 12. Prior art LDMOS transistors have the source coupled to the substrate through the backgate region. Therefore, prior art LDMOS transistors have their sources connected to ground potential. This limits their scope of applicability.

It should also be noted that the distance between the bottom of drift region 18 and the top of isolation region 14a must have a minimum thickness such that the sum of the depletion regions formed at the drift region 18-epi region 16 interface and epi region 16-isolation region 14a interface during reverse bias conditions remain smaller than epi region 16 thickness so that, at the rated transistor voltage, unrestrained RESURF action may occur.

Figure 2:
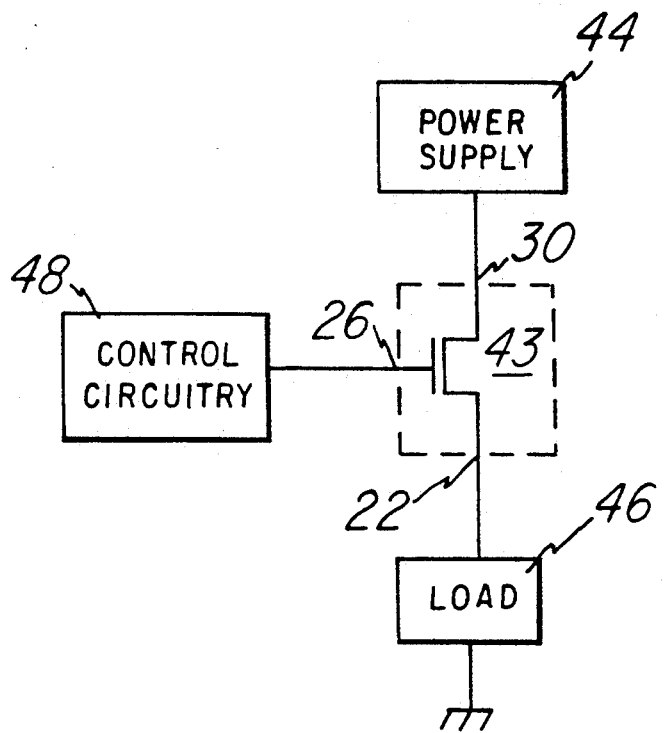
FIG. 2 is a block diagram illustrating a high side driver circuit configuration.

FIG. 2 is an illustration of a high side driver. Power transistor 10 of FIG. 1 has drain 30 coupled to a power supply 44, gate 26 coupled to control circuitry 48, and source 24 coupled to a load 46. Transistor 10 has its source 24 electrically isolated from ground (substrate 12); otherwise, load 46 would be "shorted out" and transistor 10 would not drive load 46. Transistor 10 is an excellent choice for a high side drive configuration due to its isolation feature.

Figure 3:
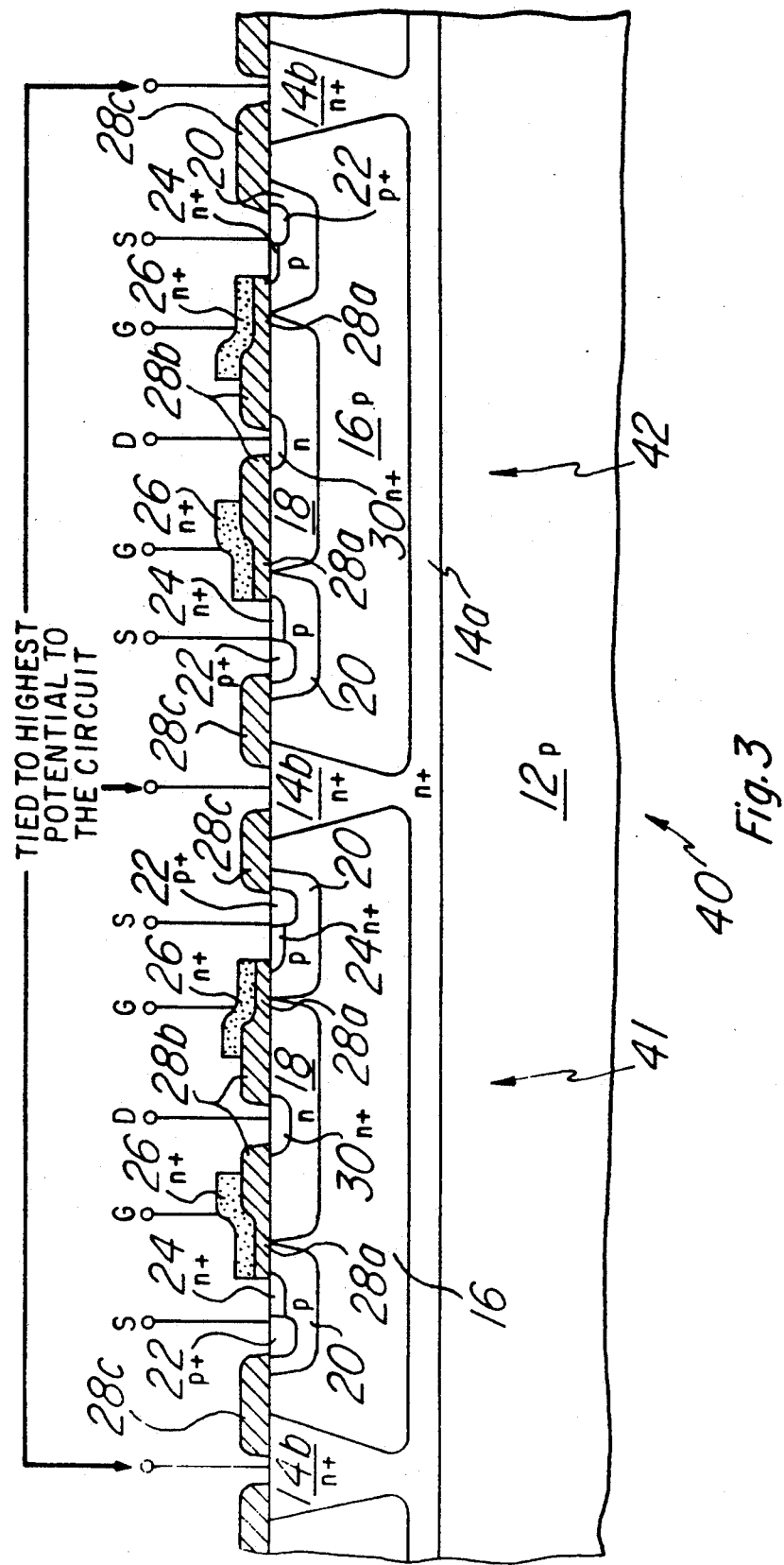
FIG. 3 is a cross section drawing illustrating an alternative embodiment of the invention.

FIG. 3 illustrates an alternative embodiment of the invention. Semiconductor chip 40 has two RESURF LDMOS transistors 41 and 42 that embody the source isolation methodology shown in FIG. 1. FIG. 3, however, has an additional feature of isolation region 14a being shared between transistors 41 and 42. Multiple RESURF LDMOS transistors using the same isolation region 14a saves die area since sinker region 14b located between transistors 41 and 42 serves as an electrical isolation for both transistor 41 and transistor 42. The two individual RESURF LDMOS transistors 4 and 42 require only three sinker regions 14b. The isolation region 14a, shared among transistors 41 and 42, contributes to a reduction of die area by reducing the number of sinker regions 14b when multiple power transistors are required on a single semiconductor chip. Additionally, isolation region 14a is specified as being connected to the highest potential in the circuit containing transistors 41 and 42. This allows each transistor, 41 and 42, to operate independently of one another and prevent transistor leakage by preventing forward biasing between isolation region 14a/epi region 16 and isolation region 14a/substrate 12 juctions.

The power transistor according to the preferred embodiment of the invention with reference to FIG. 1 includes a source, gate, and drain formed within an epitaxial layer. The epitaxial layer lies within an isolation region. A drift region is also formed within the epitaxial layer. This advantageously provides a power transistor having its source electrically isolated from its substrate. Multiple power transistors may be formed on one semiconductor chip. By forming the power transistor on P type semiconductor material, compatibility with high performance CMOS circuitry is established.

Another advantage of transistor 10 allows a power transistor to be fabricated on the same semiconductor die with high performance sub-micron CMOS circuitry. CMOS circuitry typically requires a P type semiconductor substrate. Combining high performance CMOS circuitry with low RDSon power transistors on the same chip has great potential in automotive or industrial control markets that require intelligent power technologies.

Although the invention has been described with reference to the preferred embodiments herein, this description is not to be construed in a limiting sense. Various modifications of the disclosed embodiments will become apparent to persons skilled in the art upon reference to the description of the invention. It is therefore contemplated that the appended claims will cover any such modifications or embodiments as fall within the true scope of the Invention.

What is claimed is:

1. A power transistor, comprising:
   a substrate;
   an isolation region;
   an epitaxial region formed within the isolation region;
   a gate electrode formed on the epitaxial region; and
   a source drift region formed within the epitaxial region whereby a power transistor with RESURF characteristics is formed and wherein the substrate and epitaxial region, a drain region, and a region are P type semiconductor material and the isolation region, the drain region and the drift region are N type semiconductor material.

2. The power transistor of claim 1 wherein the epitaxial region has a minimum thickness such that the sum of depletion regions formed at drift region-epitaxial region and epitaxial region-isolation region interfaces during reverse bias conditions at rated transistor voltages remains less than the epitaxial region thickness.

3. A plurality of power transistors formed on a single semiconductor chip, comprising:
   a semiconductor substrate;
   a buried isolation region formed over the semiconductor substrate;
   an epitaxial layer formed over the buried isolation region;
   a plurality of vertical isolation regions formed within the epitaxial layer making electrical contact to the buried isolation region, thereby establishing a plurality of separate epitaxial tanks across the epitaxial layer; and
   a plurality of source, gate, and drain regions within the plurality of epitaxial tanks such that each epitaxial tank incorporates a separate power transistor.

4. The plurality of power transistors of claim 3 further comprising a plurality of drift regions formed within the plurality of epitaxial tanks whereby a plurality of separate RESURF transistors are formed.

* * * * *

UNITED STATES PATENT AND TRADEMARK OFFICE
CERTIFICATE OF CORRECTION

| | | |
|---|---|---|
| PATENT NO. | : 5,286,995 | Page 1 of 1 |
| APPLICATION NO. | : 07/913570 | |
| DATED | : February 15, 1994 | |
| INVENTOR(S) | : Satwinder Malhi | |

It is certified that error appears in the above-identified patent and that said Letters Patent is hereby corrected as shown below:

Claim 1, Column 4, Line 38 - Line 44 change
"a source drift region formed within the epitaxial region whereby a power transistor with RESURF characteristics is formed and wherein the substrate and epitaxial region, a drain region, and a region are P type semiconductor material and the isolation region, the drain region and the drift region are N type semiconductor material"

to

-- a source region, a drain region, and a drift region formed within the epitaxial region whereby a power transistor with RESURF characteristics is formed and wherein the substrate and epitaxial region are P type semiconductor material and the isolation region, the drain region, and the drift region are N type semiconductor material --

Signed and Sealed this

Twenty-second Day of December, 2009

David J. Kappos
*Director of the United States Patent and Trademark Office*